(12) United States Patent
Chen et al.

(10) Patent No.: US 8,482,279 B2
(45) Date of Patent: Jul. 9, 2013

(54) SYSTEM AND METHOD OF PARALLEL IMAGING FOR MAGNETIC RESONANCE IMAGING NEAR METALLIC IMPLANTS

(75) Inventors: Weitian Chen, Mountain View, CA (US); Anja C. S. Brau, Menlo Park, CA (US); Philip J. Beatty, Redwood City, CA (US)

(73) Assignee: General Electric Company, Schenectady, NY (US)

( * ) Notice: Subject to any disclaimer, the term of this patent is extended or adjusted under 35 U.S.C. 154(b) by 484 days.

(21) Appl. No.: 12/751,708

(22) Filed: Mar. 31, 2010

(65) Prior Publication Data

US 2011/0241669 A1    Oct. 6, 2011

(51) Int. Cl.
*G01V 3/00*    (2006.01)

(52) U.S. Cl.
USPC ......................................................... 324/307

(58) Field of Classification Search
USPC ........................... 324/300–322; 600/410–435
See application file for complete search history.

(56) References Cited

U.S. PATENT DOCUMENTS

| 7,495,439 | B2 * | 2/2009 | Wiggins | 324/309 |
| 2011/0066025 | A1 * | 3/2011 | Bahn | 600/410 |

OTHER PUBLICATIONS

Beatty, P. J. et al., "A Method for Autocalibrating 2-D Accelerated Volumetric Parallel Imaging with Clinically Practical Reconstruction Times"; Proceedings of the 15th Annual Meeting of ISMRM; Berlin, Germany; 2007.

Brau, A. C. et al., "Simultaneous Calibration Scheme for Data-Driven Parallel Imaging Reconstruction"; Proc. Intl. Soc. Mag. Reson. Med. 16; 2008.

Brau, A. C. et al., "Comparison of Reconstruction Accuracy and Efficiency Among Autocalibrating Data-Driven Parallel Imaging Methods"; Magnetic Resonance in Medicine, 59: 382-395; 2008.

Griswold, M. A. et al., "Autocalibrated Coil Sensitivity Estimation for Parallel Imaging"; NMR in Biomedicine, 19: 316-324; 2006.

Koch, K. M. et al., "A Multispectral Three-Dimensional Acquisition Technique for Imaging Near Metal Implants", Magnetic Resonance in Medicine, 61: 381-390; 2009.

Preussmann, K. P. et al., "SENSE: Sensitivity Encoding for Fast MRI", Magnetic Resonance in Medicine, 42: 952-962; 1999.

* cited by examiner

*Primary Examiner* — Dixomara Vargas
(74) *Attorney, Agent, or Firm* — Ziolkowski Patent Solutions Group, SC

(57) ABSTRACT

A system and method for magnetic resonance imaging is disclosed, the MRI apparatus comprising a computer programmed to acquire a plurality of 3D MR data sets, each 3D MR data set acquired using a central transmit frequency and a central receive frequency set to an offset frequency value that is distinct for each 3D MR data set, wherein at least a portion of each 3D MR data set is accelerated k-space data, and wherein at least one of the plurality of 3D MR data sets comprises fully-sampled calibration k-space data lines. The computer is also programmed to determine reconstruction weights from the fully-sampled calibration k-space data lines, reconstruct an image for each 3D MR data set using the reconstruction weights from the fully-sampled calibration k-space data lines to synthesize unacquired data, and generate a composite image from the reconstructed images based on the plurality of 3D MR data sets.

20 Claims, 4 Drawing Sheets

SYSTEM AND METHOD OF PARALLEL IMAGING FOR MAGNETIC RESONANCE IMAGING NEAR METALLIC IMPLANTS

BACKGROUND OF THE INVENTION

Embodiments of the invention generally to magnetic resonance (MR) imaging and, more particularly, MR imaging near metallic implants.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of MR imaging in musculoskeletal (MSK) diagnostics is a rapidly growing field. Arthroplasty is the surgical placement of implants. The population of patients having some form of arthroplastic implant, and particularly metallic implants, is quite large and growing rapidly. However, most materials that are robust and durable enough to utilize for bone replacements will have magnetic properties that, when placed in a typical $B_0$ magnetic field, induce extraneous fields of amplitude and spatial variation that are large compared to the field offsets utilized in conventional spatial encoding. Accordingly, these materials can introduce distortions in the main magnetic field resulting in an inhomogeneous magnetic field.

While the signal loss induced by these field gradients can largely be regained through the use of Hahn spin-echoes, the distortion they produce in both the readout and slice directions are drastic and are typically unacceptable for clinical evaluation. Despite these challenges, MRI has been shown to be quite useful in the diagnosis of degenerative conditions in arthroscopic patients. In particular, MRI has been used to screen periprosthetic soft tissues, diagnose osteolysis, and visualize implant interfaces. These diagnostic mechanisms benefit significantly from visual information near implant interfaces. Unfortunately, artifacts induced by the implants in conventional MRI images are most severe near the implant interfaces.

A more promising approach to magnetic resonance imaging near metallic implants is known as Multi-Acquisition Variable-Resonance Image Combination (MAVRIC). MAVRIC involves the acquisition of multiple 3D MR data sets, where the center transmission frequency and the center reception frequency of each 3D MR data acquisition are set to an offset frequency that is distinct for each 3D MR data set, thus imaging different regions around a metal implant. A single image is then constructed from the 3D MR data sets (using, e.g., a sum of squares computation), the single image having reduced artifacts and reduced image distortion. However, a drawback of the MAVRIC technique is its prolonged scan time, which can reach upwards of 20-25 minutes under common circumstances.

To address the issue of prolonged scan time, it is possible to apply parallel imaging techniques to MAVRIC to reduce the overall scan time. As is known in the art, parallel imaging reconstruction can generally be divided into two categories: 1) SENSE-based techniques (Sensitivity Encoding), which estimate coil sensitivity profiles from low-resolution calibration images, which can then be used to unwrap aliased pixels in image space using a direct inversion algorithm; and 2) GRAPPA-based techniques (Generalized Auto-calibrating Partially Parallel Acquisition), which calculate reconstruction weights necessary to synthesize unacquired data directly from acquired data in k-space using an algorithm that does not require coil sensitivity estimates. However, SENSE-based parallel imaging techniques have proven to be ineffective in MAVRIC imaging, as metallic implants can cause large signal voids in images. These large signal voids create difficulties in sensitivity map estimation for SENSE-based techniques, which may result in artifacts in the final image. On the other hand, data-driven parallel imaging techniques such as GRAPPA and ARC (Autocalibrating Reconstruction for Cartesian imaging) have been shown to be insensitive to the effects of the large signal voids caused by metallic implants, as the unaliased weights in GRAPPA and ARC methods are estimated by minimizing residuals weighted by magnetization.

While data-driven parallel imaging techniques have been shown to be effective in reducing scan times for imaging around metallic implants, auto-calibrated data-driven parallel imaging techniques (such as auto-calibrated ARC) are still computationally time consuming, as calibration data is determined for an acquired 3D MR data set at each offset frequency.

It would therefore be desirable to have a system and method capable of parallel imaging for such application with reduced calibration computation time.

BRIEF DESCRIPTION OF THE INVENTION

Embodiments of the invention provide an MRI apparatus comprising a magnetic resonance imaging (MRI) system having a plurality of gradient coils positioned about a bore of a magnet, an RF transceiver system, and an RF switch controlled by a pulse module to transmit RF signals to an RF coil assembly to acquire MR images. The MRI apparatus also comprises a computer programmed to acquire a plurality of three-dimensional (3D) MR data sets, each 3D MR data set acquired using a central transmit frequency and a central receive frequency set to an offset frequency value that is distinct for each 3D MR data set, wherein at least a portion of each 3D MR data set is accelerated k-space data, and wherein at least one of the plurality of 3D MR data sets comprises fully-sampled calibration k-space data lines. The computer is also programmed to determine reconstruction weights from the fully-sampled calibration k-space data lines, reconstruct an image for each 3D MR data set using the reconstruction weights from the fully-sampled calibration k-space data lines to synthesize unacquired data, and generate a composite image from the reconstructed images based on the plurality of 3D MR data sets.

In accordance with another aspect of the invention, a method of magnetic resonance (MR) imaging is shown, the method comprising determining a distinct central frequency for each of a plurality of 3D MR data acquisitions, and performing the plurality of 3D MR data acquisitions, each 3D MR data acquisition having a central transmit frequency and a central receive frequency set to the distinct central frequency determined therefor, wherein at least a portion of each 3D MR data acquisition is accelerated k-space data, and wherein at least one of the plurality of 3D MR data acquisitions comprises fully-sampled calibration k-space data lines. The method also comprises determining reconstruction weights from the fully-sampled calibration k-space data lines, reconstructing an image for each 3D MR data acquisition using the reconstruction weights to synthesize unacquired data, and generating a composite image from the plurality of images reconstructed from the plurality of 3D MR data acquisitions.

In accordance with another aspect of the invention, a computer readable storage medium is disclosed, the computer readable storage medium having stored thereon a computer program comprising instructions which when executed by a computer cause the computer to set a center transmission frequency and a center reception frequency of a first 3D MR acquisition equal to a first center frequency offset, execute the first 3D MR acquisition to acquire a first set of 3D MR data, wherein at least a portion of the first set of 3D MR data is accelerated k-space data, and set a center transmission frequency and a center reception frequency of a second 3D MR acquisition equal to a second center frequency offset different than the first center frequency offset. The computer program further comprises instructions which execute the second 3D MR acquisition to acquire a second set of 3D MR data, wherein at least a portion of the second set of 3D MR data is accelerated k-space data, determine reconstruction weights from a region of fully-sampled calibration k-space data lines, the fully-sampled calibration k-space data lines being present in at least one of the first set of 3D MR data and the second set of 3D MR data, reconstruct an image of each of the first set of 3D MR data and the second set of MR data using the reconstruction weights to synthesize unacquired data, and reconstruct a composite image based on the reconstructed images of the respective first and second sets of 3D MR data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
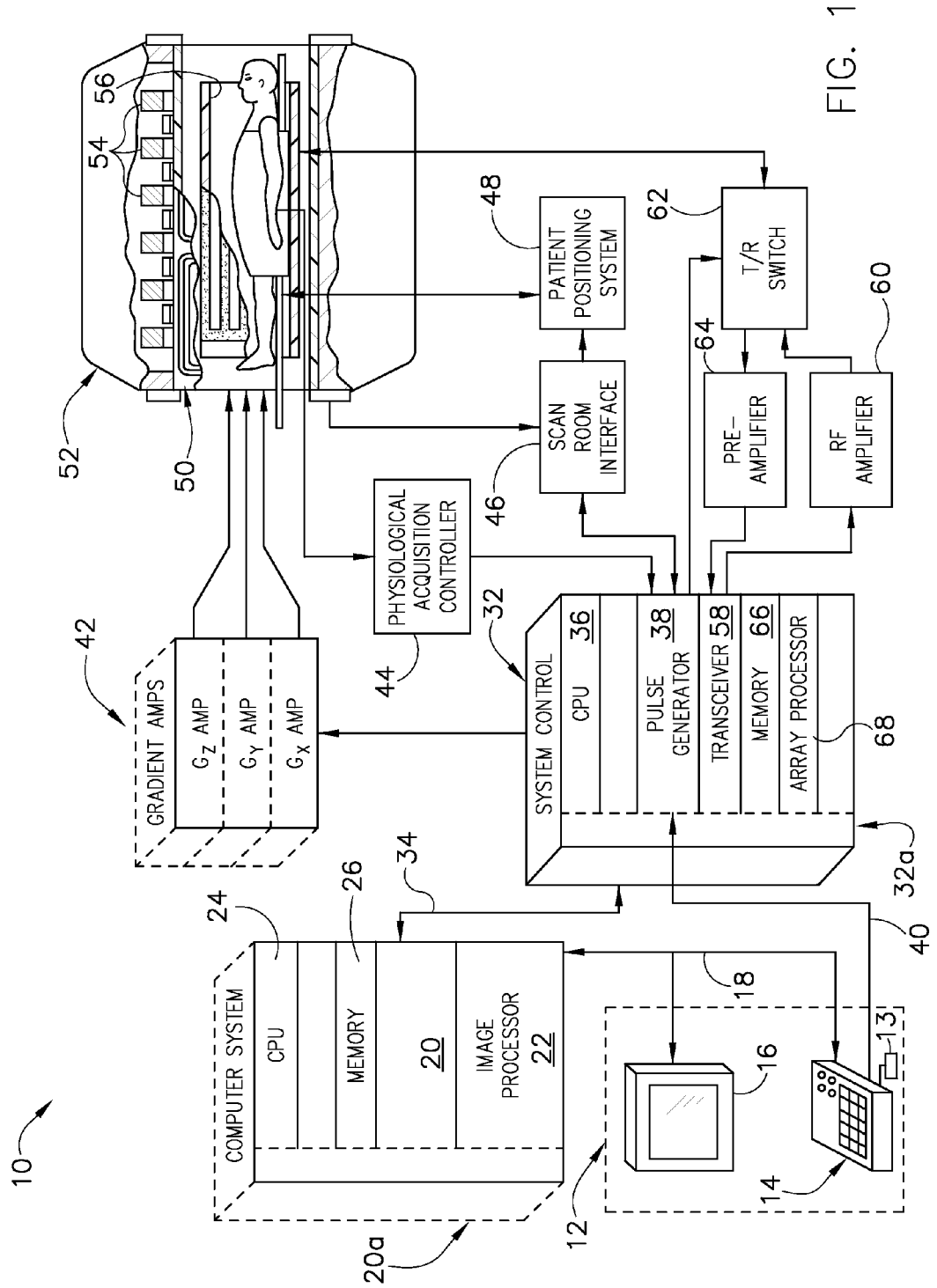
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
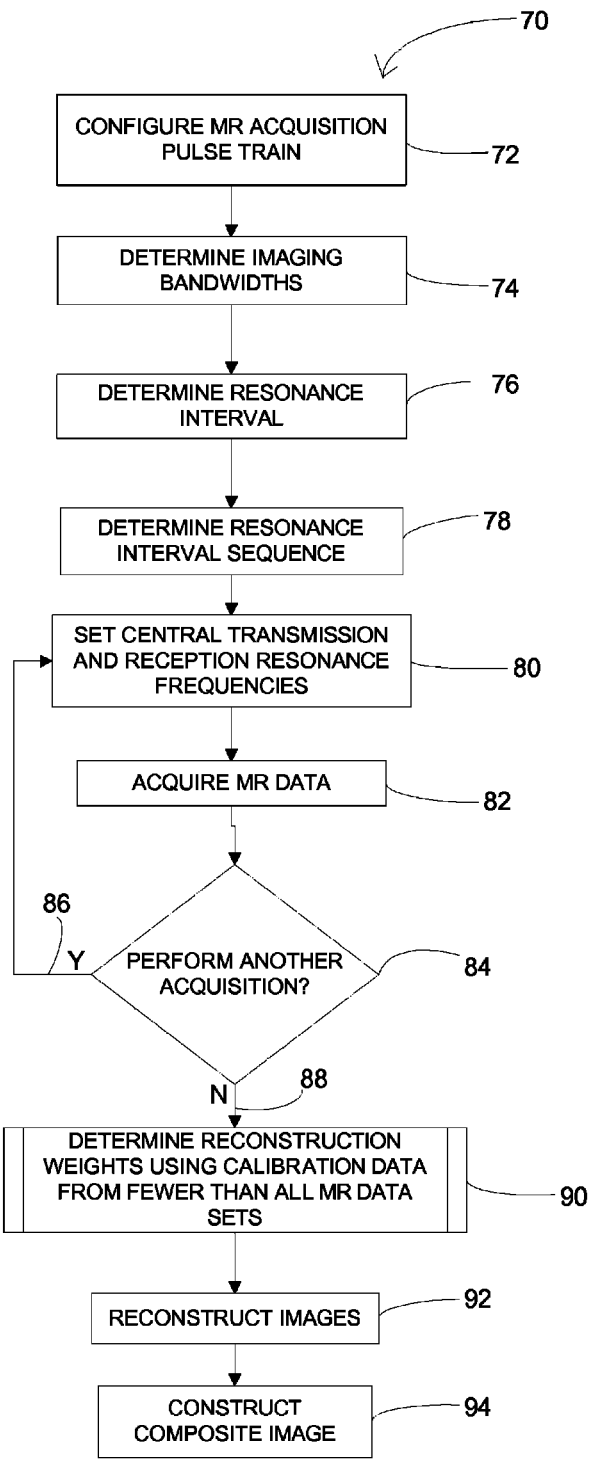
FIG. 2 is a flowchart illustrating a technique for MAVRIC imaging using data-driven parallel imaging according to an embodiment of the invention.

FIG. 2 shows a flowchart illustrating a MAVRIC technique 70 for MR imaging near or around patient metallic implants according to an embodiment of the invention. In an embodiment of the invention, computer system 20 may be programmed to perform technique 70. Technique 70 begins with configuring a pulse train of an MR acquisition pulse sequence at block 72 to be used during each MR acquisition of an MR imaging scan to acquire a 3D MR data set. At block 74, imaging bandwidths for the MR acquisitions are determined. An excitation pulse bandwidth for the MR acquisition pulse sequence to be used for acquiring MR data is determined, as well as a bandwidth of utilized refocusing pulses. The utilized refocusing pulse bandwidth is determined to be equal to or less than the bandwidth of the excitation pulse. A receiver bandwidth for the receive coil array used to acquire MR data during the MR acquisition pulse sequence is set to a bandwidth larger than that typically used in 3D Fast Spin Echo (FSE) imaging. For example, the receiver bandwidth may be set to +/−125 kHz. It is contemplated that the receiver bandwidth may also be set to a value greater than +/−125 kHz. In the described technique, off-resonance readout distortion is limited to frequency offsets contained in the RF refocusing band. Setting the receiver bandwidth accordingly helps to minimize this residual readout distortion in reconstructed images.

A resonance interval is determined at block 76 that represents an offset for both the center resonance frequency for transmission and the center resonance frequency for reception between sets of acquired MR data. According to an embodiment of the invention, the resonance interval is less than the bandwidth of the utilized refocusing pulses. At block 78, a resonance interval sequence is determined for acquiring 3D MR data sets. The resonance interval sequence includes offset frequency values, or $B_0$ values, to which central transmission and central reception resonance frequencies are set during MR acquisition. In an embodiment of the invention, the resonance interval sequence includes an offset frequency value of zero. Additional values in the resonance interval sequence include multiples of the resonance interval. For example, the resonance interval sequence may include values for the central transmission and central reception resonance frequencies to be set to each 1 kHz offset step in the range −7 kHz to +7 kHz.

In an embodiment of the invention, the resonance interval sequence is set to interleave or interlace the offset frequency values such that sequential MR acquisitions based on the offset frequency values do not acquire MR data with the central transmission and central reception resonance frequencies set to sequential offset frequency values. As an example, an interleaved resonance interval sequence with a 1 kHz resonance interval (or offset step) in the range −7 kHz to +7 kHz may have the following order: [−7, 1, −5, 3, −3, 5, −1, 7, −6, 0, −4, 6, −2, 4, 2 kHz]. Accordingly, neighboring values in the resonance interval sequence are separated by more than the offset step of 1 kHz. Interleaving the resonance interval sequence in this manner reduces interaction between 3D MR data acquisitions in an imaging scan. As described further below, each offset frequency value in the resonance interval sequence is used as the central transmission and reception frequency for a different 3D MR data acquisition. An MR imaging scan (or protocol) may be configured such that a first set of acquisitions uses a resonance interval sequence with the offset frequency values [−7, 1, −5, 3, −3, 5, −1, 7 kHz] during a single scan and such that a second set of acquisitions uses a resonance interval sequence with the offset frequency values [−6, 0, −4, 6, −2, 4, 2 kHz] during another single scan. The resonance interval sequence values listed above are illustrative only and do not limit the invention. Other and different orders and values for the resonance interval sequence values are considered and are within the scope of the invention.

At block 80, the central transmission and central reception resonance frequencies for a 3D MR data acquisition are both set to one of the values in the resonance interval sequence. In particular, the central transmission frequency and the central reception frequency for the acquisition are set to the same offset frequency value. Next, 3D MR data is acquired at block 82 using the scan parameters and sequences configured and determined in the previous steps of technique 70. In conventional MAVRIC imaging, the 3D MR data may be acquired using non-parallel imaging techniques, as discussed above. However, in accordance with embodiments of the invention, the 3D MR data is acquired using a data-driven parallel imaging method, e.g., ARC. Thus, at block 82, at least a portion of the 3D MR data acquired is accelerated (i.e., undersampled) MR data. However, an additional region of fully-sampled calibration k-space data lines is generally acquired at or near the center of k-space, wherein the fully-sampled k-space data lines are used to determine reconstruction weights for synthesizing unacquired k-space data, as will be discussed below.

At block 84, it is determined if another accelerated 3D MR data acquisition should be performed. If all the offset frequency values in the resonance interval sequence have not been used 86, then process control returns to block 80 for setting the central transmission and central reception resonance frequencies for the next 3D MR data acquisition to another of the offset frequency values in the resonance interval sequence and at block 82 3D MR data for another 3D MR data set is acquired as described above.

However, if all of the offset frequency values in the resonance interval sequence have been used 88, reconstruction weights used to synthesize the unacquired k-space data for all accelerated 3D MR data sets are calculated at block 90. In accordance with embodiments of the invention, the reconstruction weights are calculated using the fully-sampled k-space data lines from fewer than all 3D MR data sets acquired. Conventionally, calibration data would be individually determined for each 3D MR data set based on fully-sampled calibration k-space data acquired in each 3D MR data set. Embodiments of the invention, however, calculate the calibration data used in reconstruction of all images from fewer than all 3D MR data sets, as will be described in more detail below with respect to FIGS. 3, 4, 5, and 6.

Once the reconstruction weights have been calculated at block 90, images corresponding to each 3D MR data set are reconstructed at block 92, wherein the reconstruction weights are used to synthesize unacquired data in each 3D MR data set, similar to conventional ARC parallel imaging. Unlike conventional ARC parallel imaging, though, calibration is performed on fully-sampled calibration k-space data from fewer than all data sets, thereby significantly reducing the parallel imaging computational time (and overall scan time) and increasing calibration accuracy, as signal void in the calibration data is reduced.

Finally, after images corresponding to each 3D MR data set are reconstructed at block 92, a single composite image is constructed at block 94. A sum-of-squares technique can be used on the reconstructed images to generate the composite image, but the invention is not limited as such. Thus, using the parallel imaging technique set forth in the embodiment above, a large number of 3D data sets can be acquired in MAVRIC, but computation time and overall scan time can be reduced, as calibration data is not collected at every frequency.

Figure 3:
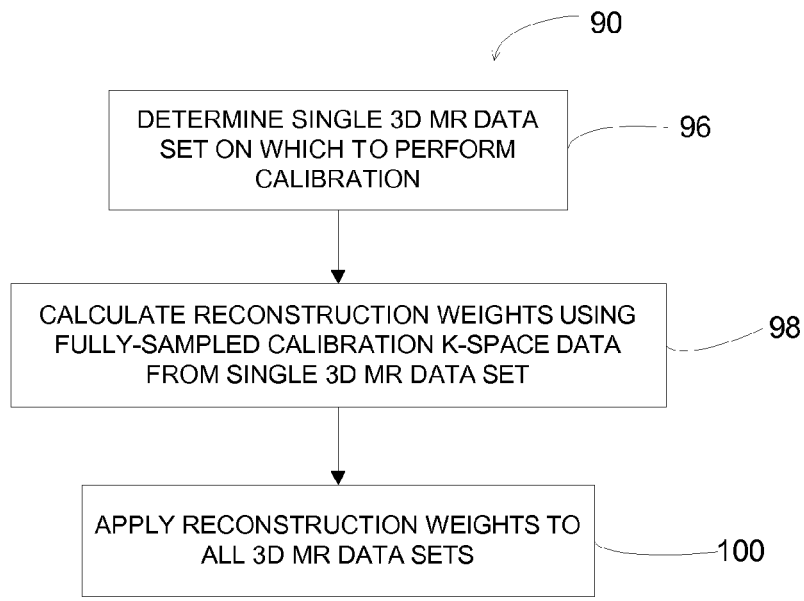
FIG. 3 is a flowchart illustrating steps for determining reconstruction weights for a process of the technique of FIG. 2 according to an embodiment of the invention.

Next, referring to FIG. 3, an embodiment contemplated for carrying out the determination of reconstruction weights at block 90 is shown. In this embodiment, calibration is performed on a single 3D MR data set, thereby eliminating the need for computationally-expensive calibration to be performed on each and every 3D MR data set at each frequency. First, the particular 3D MR data set to be used in performing calibration is determined at block 96. Preferably, the determined 3D MR data set has an offset frequency value of zero, as this on-resonance data typically has the maximum signal among the varied 3D MR data sets acquired at different frequency offsets in MAVRIC acquisition. However, embodiments of the invention are not limited to selecting only the 3D MR data set having an offset frequency value of zero, as other 3D MR data sets having non-zero offset frequencies may contain the maximum signal considered beneficial to calibration. Next, at block 98, the reconstruction weights are calculated using the fully-sampled k-space data obtained from the single 3D MR data set. Preferably, the reconstruction weights are calculated using the known ARC parallel imaging technique. However, other data-driven parallel imaging methods (e.g., GRAPPA) may also be suitable. Finally, the calculated reconstruction weights are applied to all 3D MR data sets at block 100. Thus, reconstruction weights calculated from a single 3D MR data set at a particular frequency can be effectively applied to all other 3D MR data sets at different frequencies in MAVRIC acquisition, thereby reducing overall parallel imaging computation time. Referring back to FIG. 2, upon completion of the above steps in block 90, multiple images related to each 3D MR data set are reconstructed at block 92, and are then combined to form a composite image in accordance with the MAVRIC acquisition technique at block 94.

Figure 4:
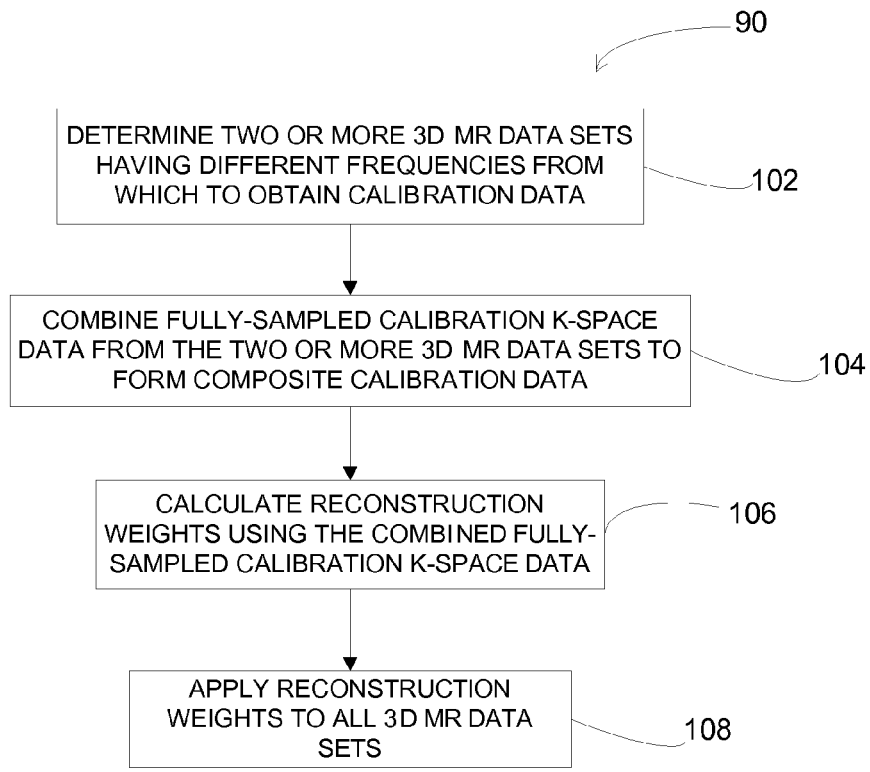
FIG. 4 is a flowchart illustrating steps for determining reconstruction weights for a process of the technique of FIG. 2 according to another embodiment of the invention.

FIG. 4 shows another embodiment contemplated for carrying out the determination of reconstruction weights at block 90 of FIG. 2. In this embodiment, calibration is performed using combined calibration data from two or more 3D MR data sets acquired at different frequencies, thereby reducing computation time. The two or more 3D MR data sets having different offset frequencies that are to be used in performing calibration are determined at block 102. One of the determined 3D MR data sets may have an offset frequency value of zero, while the other 3D MR data set(s) is off-resonance. However, embodiments of the invention are not limited as such, and the determined 3D MR data sets may each have offset frequency values other than zero. Next, at block 104, the fully-sampled calibration k-space data from the two or more 3D MR data sets is combined to form a single set of composite calibration data. By combining the calibration k-space data from two or more 3D MR data sets in this way, potential errors that can arise due to signal voids in a single calibration data set may be reduced. Next, at block 106, reconstruction weights are calculated using the combined fully-sampled k-space data obtained from the two or more 3D MR data sets. The reconstruction weights are calculated using any suitable data-driven parallel imaging method (e.g., ARC). Finally, the calculated reconstruction weights are applied to all 3D MR data sets at block 108. By calculating reconstruction weights from fewer than all 3D MR data sets in this way, overall parallel imaging computation time can be reduced.

Figure 5:
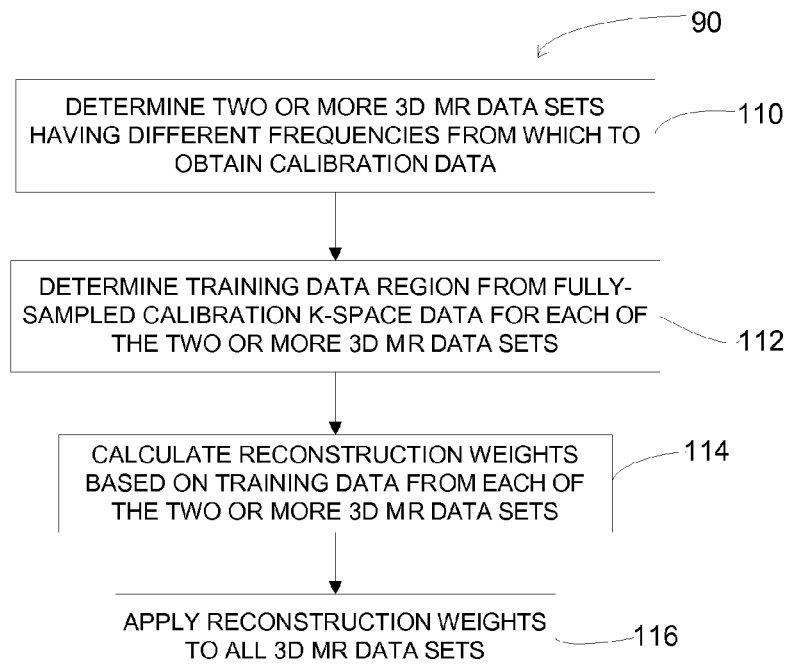
FIG. 5 is a flowchart illustrating steps for determining reconstruction weights for a process of the technique of FIG. 2 according to another embodiment of the invention.

Next, referring to FIG. 5, an additional embodiment contemplated for carrying out the determination of reconstruction weights at block 90 is shown. As with the embodiment described above with respect to FIG. 4, the embodiment shown in FIG. 5 uses calibration data from two or more of the plurality of 3D MR data sets to determine reconstruction weights. That is, two or more 3D MR data sets having different offset frequencies from which calibration data will be obtained are determined at block 110. It is to be understood that while more than two 3D MR data sets are to be determined at block 110, fewer than all 3D MR data sets are to be used in accordance with this embodiment. Next, at block 112, training data regions are determined from each of the fully-sampled calibration k-space data regions of the two or more 3D MR data sets. As is known from conventional data-driven parallel imaging methods, the training data regions each comprise source data (or acquired data) and target data, wherein reconstruction weights are derived by minimizing the fit error for the training data region. In the present embodiment, the training data regions are located in the same area of each respective fully-sampled calibration k-space data region of the 3D MR data sets such that each training data region shares the same coil setup and field-of-view, albeit with differing underlying magnetization (e.g., image contrast, phase, SNR, etc.) due to the differing offset frequencies. Next, at block 114, reconstruction weights are calculated by minimizing the fit error over all of the training data regions from each of the two or more 3D MR data sets determined at block 110. In this way, calibration data from multiple unique 3D MR data sets can be obtained, thereby enabling improved reconstruction weight calculation while still reducing the computational burden of determining calibration data for each 3D MR data set. The calculated reconstruction weights are then applied to all 3D MR data sets at block 116, after which the steps in block 90 are completed in accordance with this embodiment.

Figure 6:
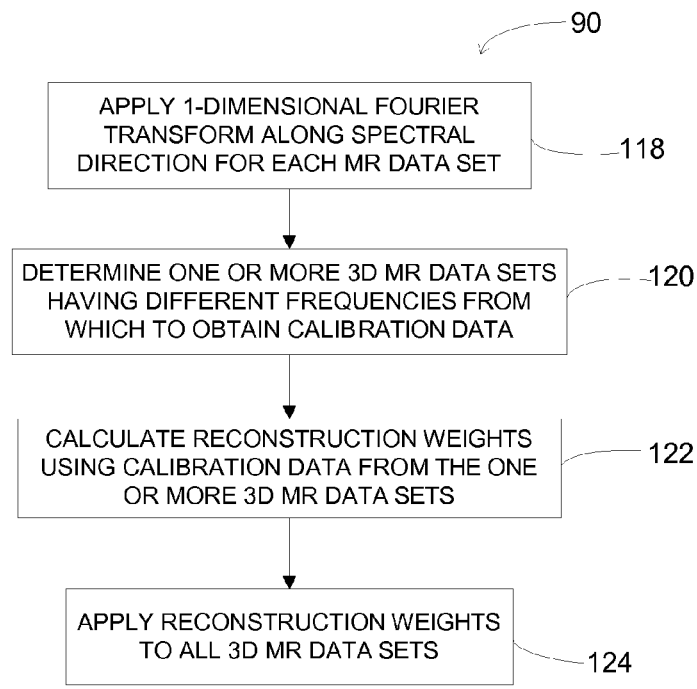
FIG. 6 is a flowchart illustrating steps for determining reconstruction weights for a process of the technique of FIG. 2 according to another embodiment of the invention.

Yet another embodiment contemplated for carrying out the determination of reconstruction weights at block 90 is shown with respect to FIG. 6. As discussed above in reference to FIG. 2, the MAVRIC technique involves the acquisition of a plurality of 3D MR data sets, wherein each 3D MR data set is acquired having a different offset frequency value. In actuality, each 3D MR data set can be considered a 4D data set, with the fourth dimension being frequency. In accordance with the embodiment shown in FIG. 6, a 1-dimensional Fourier Transform is applied along the spectral direction for each 4D data set at block 118, thereby transforming the fourth dimension into time. Then, at block 120, the particular MR data set(s) from which calibration data is obtained is determined. Using the determined MR data set(s) from block 120, reconstruction weights are calculated at block 122. The technique used to calculate the reconstruction weights may be any of the calibration techniques described above with respect to FIGS. 3-5, depending, of course, on the number of MR data sets used to obtain calibration data. At block 124, the reconstruction weights are applied to all MR data sets, at which point the steps of block 90 are completed, and the process reverts back to that described in FIG. 2, wherein multiple images related to each 3D MR data set are reconstructed at block 92, and are then combined to form a composite image in accordance with the MAVRIC acquisition technique at block 94. An advantage of performing the data-driven parallel imaging technique (e.g., ARC) after application of the 1-dimensional Fourier transform is that 3D images along the time dimension have more signal than 3D images along the frequency dimension, thereby making the data-driven parallel imaging more robust. Alternatively, after application of the 1-dimensional Fourier transform to all MR data sets, it is also possible to use the 3D image having maximum signal as the final image, which may provide reduced artifacts compared to the sum-of-squares image reconstruction technique described above with respect to FIG. 2.

While the embodiments described above with respect to FIGS. 3-6 are set forth individually, it is envisioned that these methods are not mutually exclusive and could be used in combination with one another.

A technical contribution for the disclosed method and apparatus is that it provides for a computer implemented MR imaging technique for MR imaging near metallic implants using a data-driven parallel imaging method.

Embodiments of the invention provide an MRI apparatus comprising a magnetic resonance imaging (MRI) system having a plurality of gradient coils positioned about a bore of a magnet, an RF transceiver system, and an RF switch controlled by a pulse module to transmit RF signals to an RF coil assembly to acquire MR images. The MRI apparatus also comprises a computer programmed to acquire a plurality of three-dimensional (3D) MR data sets, each 3D MR data set acquired using a central transmit frequency and a central receive frequency set to an offset frequency value that is distinct for each 3D MR data set, wherein at least a portion of each 3D MR data set is accelerated k-space data, and wherein at least one of the plurality of 3D MR data sets comprises fully-sampled calibration k-space data lines. The computer is also programmed to determine reconstruction weights from the fully-sampled calibration k-space data lines, reconstruct an image for each 3D MR data set using the reconstruction weights from the fully-sampled calibration k-space data lines to synthesize unacquired data, and generate a composite image from the reconstructed images based on the plurality of 3D MR data sets.

In accordance with another aspect of the invention, a method of magnetic resonance (MR) imaging is shown, the method comprising determining a distinct central frequency for each of a plurality of 3D MR data acquisitions, and performing the plurality of 3D MR data acquisitions, each 3D MR data acquisition having a central transmit frequency and a central receive frequency set to the distinct central frequency determined therefor, wherein at least a portion of each 3D MR data acquisition is accelerated k-space data, and wherein at least one of the plurality of 3D MR data acquisitions comprises fully-sampled calibration k-space data lines. The method also comprises determining reconstruction weights from the fully-sampled calibration k-space data lines, reconstructing an image for each 3D MR data acquisition using the reconstruction weights to synthesize unacquired data, and generating a composite image from the plurality of images reconstructed from the plurality of 3D MR data acquisitions.

In accordance with another aspect of the invention, a computer readable storage medium is disclosed, the computer readable storage medium having stored thereon a computer program comprising instructions which when executed by a computer cause the computer to set a center transmission frequency and a center reception frequency of a first 3D MR acquisition equal to a first center frequency offset, execute the first 3D MR acquisition to acquire a first set of 3D MR data, wherein at least a portion of the first set of 3D MR data is accelerated k-space data, and set a center transmission frequency and a center reception frequency of a second 3D MR acquisition equal to a second center frequency offset different than the first center frequency offset. The computer program further comprises instructions which execute the second 3D MR acquisition to acquire a second set of 3D MR data, wherein at least a portion of the second set of 3D MR data is accelerated k-space data, determine reconstruction weights from a region of fully-sampled calibration k-space data lines, the fully-sampled calibration k-space data lines being present in at least one of the first set of 3D MR data and the second set of 3D MR data, reconstruct an image of each of the first set of 3D MR data and the second set of MR data using the reconstruction weights to synthesize unacquired data, and reconstruct a composite image based on the reconstructed images of the respective first and second sets of 3D MR data.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
   a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
   a computer programmed to:
   acquire a plurality of three-dimensional (3D) MR data sets, each 3D MR data set acquired using a central transmit frequency and a central receive frequency set to an offset frequency value that is distinct for each 3D MR data set, wherein at least a portion of each 3D MR data set is accelerated k-space data, and wherein at least one of the plurality of 3D MR data sets comprises fully-sampled calibration k-space data lines;
   determine reconstruction weights from the fully-sampled calibration k-space data lines;
   reconstruct an image for each 3D MR data set using the reconstruction weights from the fully-sampled calibration k-space data lines to synthesize unacquired data; and
   generate a composite image from the reconstructed images based on the plurality of 3D MR data sets.

2. The MRI apparatus of claim 1 wherein the computer is further programmed to determine the reconstruction weights using fully-sampled calibration k-space data lines from only one of the plurality of 3D MR data sets.

3. The MRI apparatus of claim 2 wherein the one of the plurality of 3D MR data sets used to determine the reconstruction weights has an offset frequency value of zero.

4. The MRI apparatus of claim 1 wherein the computer is further programmed to determine the reconstruction weights using fully-sampled calibration k-space data lines from at least two of the plurality of 3D MR data sets.

5. The MRI apparatus of claim 4 wherein the computer is further programmed to combine the fully-sampled calibration k-space data lines from the at least two 3D MR data sets, and wherein the reconstruction weights are determined from the combined fully-sampled calibration k-space data lines.

6. The MRI apparatus of claim 4 wherein the computer is further programmed to determine training data sets from each of the at least two 3D MR data sets, each training data set representing a sub-set of data related to each of the fully-sampled calibration k-space data lines from the at least two 3D MR data sets, and wherein the reconstruction weights are calculated based on the determined training data sets.

7. The MRI apparatus of claim 6 wherein each training data set is defined in k-space.

8. The MRI apparatus of claim 1 wherein the computer is further programmed to perform a 1D Fourier transform along the spectral direction for each acquired 3D MR data set prior to determining the reconstruction weights from the fully-sampled calibration k-space data lines.

9. The MRI apparatus of claim 1 wherein the computer is further programmed to perform a sum-of-squares technique on the reconstructed images to generate the composite image.

10. The MRI apparatus of claim 1 wherein the computer is further programmed to interleave offset frequency values used to acquire the plurality of 3D MR data sets such that sequential 3D MR data sets are acquired using non-sequential offset frequency values.

11. A method of magnetic resonance (MR) imaging comprising:
determining a distinct central frequency for each of a plurality of 3D MR data acquisitions;
performing the plurality of 3D MR data acquisitions, each 3D MR data acquisition having a central transmit frequency and a central receive frequency set to the distinct central frequency determined therefor, wherein at least a portion of each 3D MR data acquisition is accelerated k-space data, and wherein at least one of the plurality of 3D MR data acquisitions comprises fully-sampled calibration k-space data lines;
determining reconstruction weights from the fully-sampled calibration k-space data lines;
reconstructing an image for each 3D MR data acquisition using the reconstruction weights to synthesize unacquired data; and
generating a composite image from the plurality of images reconstructed from the plurality of 3D MR data acquisitions.

12. The method of claim 11 wherein determining the reconstruction weights comprises using the fully-sampled calibration k-space data lines from no more than one of the plurality of 3D MR data acquisitions.

13. The method of claim 11 wherein determining the reconstruction weights comprises using the fully-sampled calibration k-space data lines from at least two of the plurality of 3D MR data acquisitions.

14. The method of claim 13 wherein determining the reconstruction weights comprises combining the fully-sampled calibration k-space data lines from the at least two of the plurality of 3D MR data acquisitions.

15. The method of claim 13 wherein determining the reconstruction weights comprises determining training data sets from each of the at least two 3D MR data acquisitions and calculating the reconstruction weights based on the determined training data sets, wherein each training data set represents a sub-set of data related to each of the fully-sampled calibration k-space data lines from the at least two 3D MR data acquisitions.

16. A computer readable storage medium having stored thereon a computer program comprising instructions which when executed by a computer cause the computer to:
set a center transmission frequency and a center reception frequency of a first 3D MR acquisition equal to a first center frequency offset;
execute the first 3D MR acquisition to acquire a first set of 3D MR data, wherein at least a portion of the first set of 3D MR data is accelerated k-space data;
set a center transmission frequency and a center reception frequency of a second 3D MR acquisition equal to a second center frequency offset different than the first center frequency offset;
execute the second 3D MR acquisition to acquire a second set of 3D MR data, wherein at least a portion of the second set of 3D MR data is accelerated k-space data;
determine reconstruction weights from a region of fully-sampled calibration k-space data lines, the fully-sampled calibration k-space data lines being present in at least one of the first set of 3D MR data and the second set of 3D MR data
reconstruct an image of each of the first set of 3D MR data and the second set of MR data using the reconstruction weights to synthesize unacquired data; and
reconstruct a composite image based on the reconstructed images of the respective first and second sets of 3D MR data.

17. The computer readable storage medium of claim 16 having further instructions to cause the computer to determine the reconstruction weights using the fully-sampled calibration k-space data lines from one of the first set of 3D MR data and the second set of 3D MR data.

18. The computer readable storage medium of claim 16 having further instructions to cause the computer to determine the reconstruction weights using combined fully-sampled calibration k-space data lines from both the first set of 3D MR data and the second set of 3D MR data.

19. The computer readable storage medium of claim 16 having further instruction to cause the computer to perform a sum-of-squares technique on the reconstructed images of the first set of 3D MR data and the second set of MR data to generate the composite image.

20. The computer readable storage medium of claim 16 wherein the instructions further cause the computer to:
set a center transmission frequency and a center reception frequency of a third 3D MR acquisition equal to a third center frequency offset;
execute the third 3D MR acquisition to acquire a third set of 3D MR data, wherein at least a portion of the third set of 3D MR data is accelerated k-space data;
reconstruct an image of the third set of 3D MR data using the reconstruction weights to synthesize unacquired data; and
reconstruct the composite image based on the reconstructed images of the respective first, second, and third sets of 3D MR data.

* * * * *